United States Patent
Smith et al.

(10) Patent No.: US 8,053,933 B2
(45) Date of Patent: Nov. 8, 2011

(54) SWITCHING MEANS FOR CONNECTING A LOAD TO A POWER SUPPLY AND ITS METHOD OF OPERATION

(75) Inventors: Steve Smith, Bullwell (GB); John Hollingworth, Nottingham (GB)

(73) Assignee: Cable Management Products Ltd., Birmingham (GB)

( * ) Notice: Subject to any disclaimer, the term of this patent is extended or adjusted under 35 U.S.C. 154(b) by 199 days.

(21) Appl. No.: 12/528,333

(22) PCT Filed: Feb. 22, 2008

(86) PCT No.: PCT/GB2008/000604
§ 371 (c)(1),
(2), (4) Date: Aug. 24, 2009

(87) PCT Pub. No.: WO2008/102147
PCT Pub. Date: Aug. 28, 2008

(65) Prior Publication Data
US 2010/0321852 A1   Dec. 23, 2010

(30) Foreign Application Priority Data
Feb. 24, 2007 (GB) .................................. 0703650.2

(51) Int. Cl.
*B23K 11/24* (2006.01)
(52) U.S. Cl. ..................................................... 307/112
(58) Field of Classification Search ............. 307/112
See application file for complete search history.

(56) References Cited

U.S. PATENT DOCUMENTS

| | | | |
|---|---|---|---|
| 4,745,511 A * | 5/1988 | Kugelman et al. | 361/8 |
| 5,818,710 A | 10/1998 | LeVan Suu | |
| 6,347,024 B1 | 2/2002 | Blain et al. | |
| 6,621,668 B1 * | 9/2003 | Sare | 361/13 |
| 6,741,435 B1 | 5/2004 | Cleveland | |

FOREIGN PATENT DOCUMENTS

| | | |
|---|---|---|
| EP | 1655753 | 5/2006 |
| FR | 2525386 | 10/1983 |
| FR | 2826798 | 1/2003 |
| GB | 2426324 | 11/2006 |
| WO | 94/13000 | 6/1994 |

OTHER PUBLICATIONS

PCT Written Opinion of the International Searching Authority.

* cited by examiner

*Primary Examiner* — Robert L. Deberadinis
(74) *Attorney, Agent, or Firm* — Dority & Manning, P.A.

(57) ABSTRACT

A switching device for controlling the supply of power from a supply to a load comprises a solid-state switch arranged in parallel with a relay of normally closed type. The solid-state switch and the relay are arranged in series with the load and the power supply. The switch also comprises a control adapted to connect the power supply to the load by applying an activation signal to the solid-state switch to cause it to conduce, then de-energizing the relay and then removing the activation signal to the solid-state switch in that order. The control is also adapted to disconnect the power supply from the load by applying an activation signal to the solid-state switch to cause it to conduct, then energizing the relay and then removing activation signal to the solid-state switch in that order. A corresponding method of operation is also disclosed.

15 Claims, 1 Drawing Sheet

Figure 1:
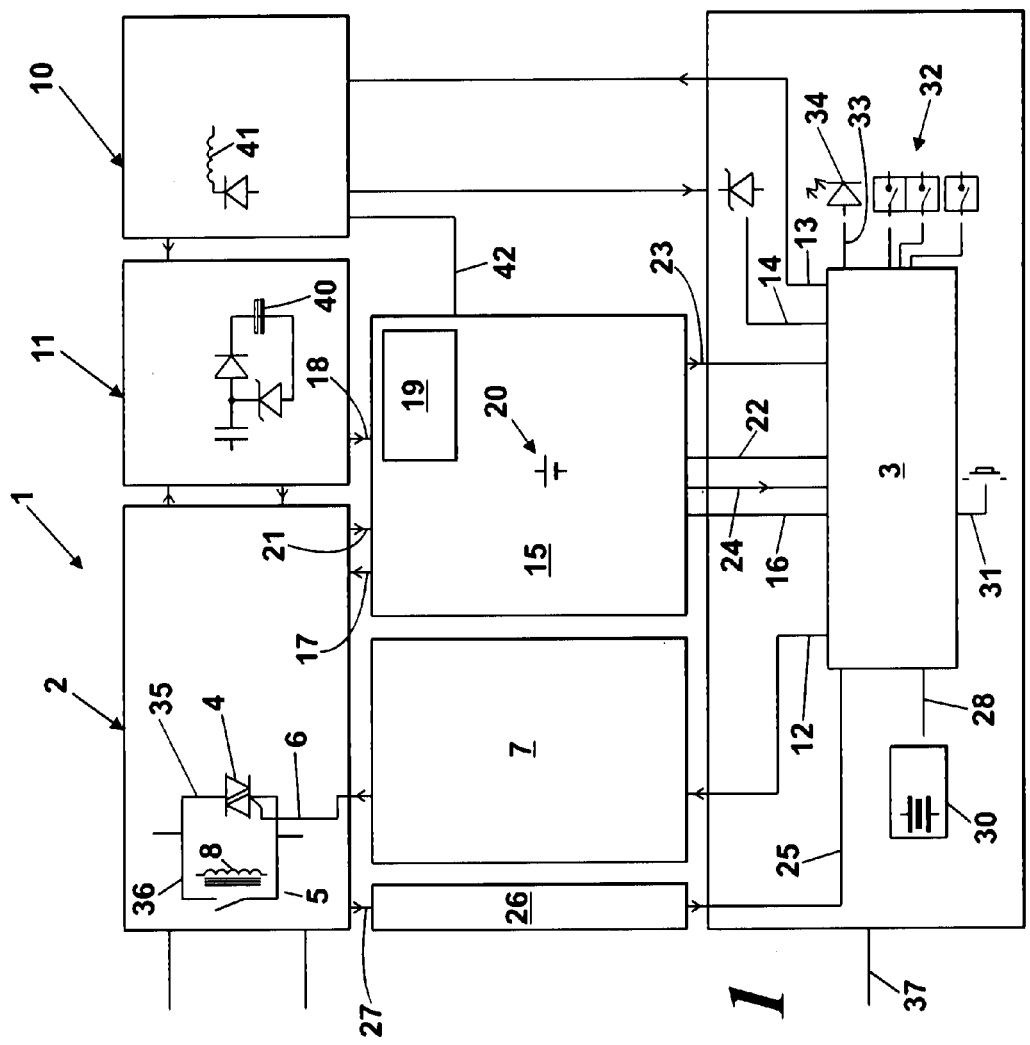

SWITCHING MEANS FOR CONNECTING A LOAD TO A POWER SUPPLY AND ITS METHOD OF OPERATION

This invention relates to a switching means for connecting a load to a power supply and its method of operation. The invention also relates to a timer switch incorporating the switching means.

It is common for a control switch to include relays to connect a load, such as a lamp, to a power supply. The relay allows a relatively low-voltage control circuit to connect a higher voltage supply, such as a mains supply, to a load. These relay arrangements have proved successful where the load is substantially a resistive load, such as a tungsten filament lamp. However, if the load is inductive, such as a fluorescent lighting, this can cause a high current draw through the relay even when the contacts are only partially closed. This is particularly a problem when the power supply is first connected to the load, as the initial current flow will be much higher than the average flow through the relay. For example, a relay rated at 15 Amps for a resistive load may only be rated at 6 Amps when the load is inductive to compensate for the high initial current draw. Thus, to compensate for this high initial current draw of these types of loads, it is known to incorporate relays of higher current ratings in control switches for inductive loads, although these relays are more expensive. However, the relays still suffer burning of their contacts due to arcing of high currents therebetween as the contacts close. Further, contact bounce can exacerbate this problem. This vastly decreases the reliability and lifetime of the relays and therefore the switch.

A further problem with the use of relays is that energy is required to hold the contacts closed. In certain applications the relay contacts may be required to be held closed for a substantial amount of time and would thus require a substantial amount of energy. This is particularly problematic as it is common for the mains power supply to be diverted from the control electronics of the control switch to the load when the switch is turned "on". Thus, at a time when the control electronics require power to energize the relay, it is instead supplied to the load. It is known to use latching relays in this type of control switch.

A latching relay only requires a small pulse to latch it between the "on" and "off" states. Therefore a continuous supply of power is not required when the load is connected to the mains power supply. The latching relay stores a small amount of power to enable it to switch the contacts to an open position when it is required to disconnect the load from the mains power supply. However, latching relays are expensive components when compared to relays of non-latching type. Further, they can be unreliable as the stored power can drain away, or they can fail to latch, which results in the control switch becoming unusable until it is manually reset.

According to a first aspect of the invention we provide a switching means for controlling the supply of power from a power supply to a load, the control switch comprising a solid-state switch arranged in parallel with a relay of normally closed type, the solid-state switch and the relay being arranged in series with the load and the power supply, the control switch also comprising a control means adapted to connect the power supply to the load by applying an activation signal to the solid-state switch to cause it to conduct, then de-energising the relay and then removing said activation signal to the solid-state switch in that order, and wherein the control means is also adapted to disconnect the power supply from the load by applying an activation signal to the solid-state switch to cause it to conduct, then energising the relay and then removing said activation signal to the solid-state switch in that order.

This is advantageous as solid-state switch is able to carry the load while the contacts of the relay close. This substantially reduces arcing and the resultant deterioration of the relay contacts. Once the relay is closed, the solid-state switch is turned off to prevent it overheating and the full load is carried by the relay. Similarly, when the load is disconnected from the mains power supply, the solid-state switch is activated to carry the load while the relay is energised causing the contacts to open. Once the relay contacts are open the solid-state switch is turned off thereby disconnecting the load. Further, as the relay is of normally closed type, power is required when the load is disconnected from the mains power supply. Thus, the present invention is advantageously arranged such that the relay is maintained in an energised state at a time when power is available for the control means.

Preferably, the power supply is the mains power supply. Alternatively it may be a stored power source, such as a battery.

Preferably, the solid-state switch comprises a triac.

Preferably, the control means comprises a micro-controller. Preferably the micro-controller is a PIC (RTM) micro-controller manufactured by Microchip Technology Inc, such as a PIC16F873.

Preferably, the control switch includes a switching capacitor that is used to provide power for opening the contacts of the relay. Preferably the control switch includes a fly back converter to charge the switching capacitor with the power required to open the contacts of the relay. Preferably, the control means is constructed and arranged such that once the relay contacts are opened by the switching capacitor, the power from the power supply maintains the contacts of the relay in the open position.

Preferably the activation signal comprises a series of pulses supplied from the control means. Preferably, a plurality of outputs from the micro-controller control means are used to supply the activation signal.

Preferably, the control means connects the load to the power supply in response to an instruction signal. Preferably the instruction signal is provided by push-button adapted to be actuated by a user, although it could be supplied by a touch sensor, a Passive Infrared (PIR) sensor or by an auxiliary device.

Preferably the control switch includes a battery to provide power for the control means when the mains power supply is connected to the load. Preferably, the battery is charged by the mains power supply when the mains power supply is disconnected from the load.

According to a second aspect of the invention we provide a method of operating a control switch that is adapted to control the supply of power from a mains power supply to a load, the control switch comprising a solid-state switch arranged in parallel with a normally closed relay, the solid-state switch and the relay being arranged in series with the load and a mains power supply, the control switch also comprising a control means adapted to connect the mains power supply to the load by the following steps;
  (i) supply a signal to the solid-state switch to cause it to conduct thereby providing a first current path between the mains power supply and the load;
  (ii) de-energize the relay such that it provides a second current path between the mains power supply and the load;

(iii) after a predetermined period of time, remove the signal supplied to the solid-state switch to cause it to interrupt the first current path;

the control means being adapted to disconnect the mains power supply from the load by the following steps;

(i) supply a signal to the solid-state switch to cause it to conduct thereby providing a first current path between the mains power supply and the load in addition to the second current path provided by the relay;

(ii) energising the relay to cause its contacts to open interrupting the second current path between the mains power supply and the load;

(iii) after a predetermined period of time, remove the signal supplied to the solid-state switch to cause it to interrupt the first current path between the mains power supply and the load.

There now follows by way of example only a detailed description of the present invention with reference to the accompanying drawings in which;

FIG. 1 shows a block circuit diagram of an embodiment of the control switch of the invention.

The embodiment of the invention described herein is a timer switch device that upon actuation will switch a lamp on and then, after a predetermined period of time, switch it off. The lamp is a fluorescent based lamp, although it could be a tungsten filament lamp or other load.

The device 1 comprises a switching means 2 and a control means 3, in the form of a microprocessor. The switching means 2 comprises a solid-state switch 4 and a relay 5 connected together in parallel. The solid-state switch comprises a triac 4, which, along with the relay 5, is arranged in series with the load (not shown). The relay 5 is of normally closed type and therefore its contacts are closed until the relay is energised. The relay 5 includes a coil 8, which is controlled by the microprocessor 3. A flyback converter 10 acting with a power control means 11 provides power to energize the coil 8. The power control means 11 receives the mains power supply. The triac 4 is adapted to receive a gate signal 6 from the microprocessor 3. As is conventional in triacs, the application of a gate signal 6 will cause the triac to conduct. The gate signal 6 from the microprocessor 3 is received via a triac drive means 7.

The gate signal 6 from the microprocessor 3 is output at 12 by a plurality of pins of the microprocessor 3. The output from the plurality of pins are combined in the triac drive means 7, to form a relatively high-frequency oscillating signal of approximately 1 kHz. The square wave output by the microprocessor 3 is partially smoothed by at least one capacitor (not shown) in the drive means 7, resulting in the high frequency pulsed gate signal 6 received at the triac 4. This signal 6 is sufficiently high frequency to maintain the triac 4 in a conductive state irrespective of what the load current through the triac 4 may be.

The flyback converter 10 receives a pulse-width modulated (PWM) drive signal from a PWM output 13 of the microprocessor 3. The PWM signal is used to charge a capacitor 40 using power from a battery 20. The operation of the flyback converter 10 will be known to those skilled in the art. However, in summary, the battery 20, via connection 42, applies a voltage across an inductor 41, which, as the current through it rises, generates a magnetic flux in its core. The PWM drive signal is used to control a transistor (not shown) that, when switched, causes the magnetic flux in the core of the inductor 41 to collapse inducing a voltage, which, via a diode (not shown) charges the capacitor 40 of the power control means 11. Each time the transistor is switched by the PWM signal, the capacitor 40 is incrementally charged. This may take up to a minute to achieve. The microprocessor 3 also receives a signal back from the flyback converter 10 indicating the accumulation of 50 Volts across the capacitor 40, which is received at voltage detection input 14. This indicates that charging of the capacitor 40 is complete and the signal from PWM output 13 is ceased.

The power control means 11 includes the capacitor 40 and also receives the mains power supply. The power control means 11 receives the charging current for the capacitor 40 from the fly-back converter 10. The power control means 11 is connected to the switching means 2 so that the capacitor 40 can be discharged across the coil 8 of the relay 5. Thus, the capacitor 40 is used to perform the initial energising of the coil 8 and therefore the switching of the switching means 2. Thus, the capacitor will hereinafter be referred to as the switching capacitor 40. Further, the power control means 11 is arranged such that the mains power supply is used to energize the coil 8 when the mains power supply is disconnected from the load.

The device 1 also includes a relay and battery control means 15, which receives a signal from a relay control output 16 of the microprocessor 3. The relay control output 16 is used to control a switching means 19, which may be in the form of at least one Metal Oxide Semiconductor Field Effect Transistor or MOSFET (not shown). The output 16 from the microprocessor 3 thus switches the MOSFET to de-energize the coil 8 of the relay 5 when it is required to connect the load to the power supply. Further, when it is required to disconnect the load from the power supply, the signal output at 16 causes the switching capacitor 40 to be connected to relay coil 8. The switching capacitor 40 discharges thereby energising the coil 8 and opening the relay contacts. The relay contacts are maintained in the open position by the mains power supply once the contacts are opened by the switching capacitor 40 and the mains power supply is disconnected from the load. Thus, a relay switching signal 17 is derived from the signal output at the relay control output 16 and is received at the coil 8.

The microprocessor 3 receives power from the relay and battery control means 15 from an output 23. The output 23 supplies the microprocessor with 3 Volts DC power. The relay and battery control means 15 includes a battery 20 that supplies power to the microprocessor 3. The battery 20 is of rechargeable and Nickel Metal-Hydride type. The battery 20 receives power to charge it from an input 21 from the coil 8. The MOSFET based switching means 19 is also arranged such that the power supplied to the relay coil 8 is directed to the battery 20 to charge it. The relay and battery control means 15 receives a battery control signal 22 from the microprocessor 3 that switches the MOSFET switches 19 to divert the mains power to the battery 20 to effect charging. The relay and battery control means 15 also outputs a voltage reading signal 24, which allows the microprocessor 3 to determine the charge of the battery 20. This enables the microprocessor 3 to monitor the charging of the battery 20 and control the supply of power to the battery 20 as appropriate. When charging is complete the signal 22 effects the switching of the MOSFET switch 19 such that the mains power supply is directed to internal ground bypassing the battery 20. Further, when the load is connected to the mains power supply, the battery 20 provides the power to maintain operation of the microprocessor 3.

The microprocessor 3 is a PIC 16F873 micro-controller manufactured by Microchip Technology Inc. The microprocessor 3 receives an input 25 from a mains phase detection means 26. The phase detection means 26 receives its input 27, which is obtained from the mains power supply into the device 1. The phase detection means 26 comprises a plurality of resistors (not shown) to ensure that the input 27 is of a suitable voltage and current for receipt by the microprocessor 3 at input 25. Input 25 is used be the microprocessor 3 to determine the zero crossing of the AC mains supply so that switching of the load can be performed at the zero crossing to reduce radio interference. The input 25 is also used to determine whether or not the mains power supply is present. The microprocessor 3 receives a clock signal 28 from a clock signal generation means 30. It also receives an actuation signal 31 from a push button. It will be appreciated that the actuation signal 31 maybe provided by a touch sensor or another device (not shown). A set of three dip switches 32 are connected to the microprocessor 3 and are used to determine a pre-set time that the microprocessor 3 waits when controlling the lamp or other load. The microprocessor 3 also has an indicator output 33, which controls the illumination of a Light Emitting Diode (LED) 34. The LED 34 is used by the microprocessor 3 to indicate its state to a user. The microprocessor 3 is adapted to make the LED 34 flash when it receives an actuation signal at 31. This indicates to the user that the command has been received. The microprocessor 3 also makes the LED 34 flash one minute prior to the timer expiring and thus the load being disconnected. Thus, the user is warned when the timer is about to expire and can reset the timer by supplying the actuation signal 31.

The microprocessor 3 is also adapted to receive a remote actuation signal 37. The remote actuation signal 37 is provided by one or more "slave" actuation switches that may be positioned at a distance from the device 1. This allows a single switch means 2 and control means 3 to be actuated by more than one actuation switch.

In use, when the microprocessor 3 is in an "off" mode, the gate signal 6 is not supplied and the relay control output signal 16 is output from the microprocessor 3 to open the contacts of the relay 5. Thus, in the "off" mode, the load is disconnected from the mains power supply. A user or another device can then supply an actuation signal 31 to the microprocessor 3 which, when the microprocessor is in "off" mode causes the microprocessor 3 to initiate the "switch on" sequence.

The switch on sequence comprises the microprocessor 3 reading the input at 25 from the phase detection means 26. When a zero crossing of the power supply is detected an internal timer is started, which lasts half a cycle of the mains power supply. Thus, at the subsequent zero crossing the microprocessor 3 outputs a signal at 12, which passes through the drive means 7, to supply the gate of the triac 4 with a pulsing gate signal 6. The triac 4 will begin to conduct thereby providing a first current path 35 between the mains power supply and the load. The microprocessor 3 then, after approximately 30 ms, ceases to supply the relay control output signal 16 to the relay and battery control means 15, which causes the de-energising of the coil 8 and therefore the relay contacts to close and as such provides a second current path 36 between the mains power supply and the load. After a predetermined period of time, which is sufficient to allow the contacts of the relay 5 to close fully (typically between 2 and 8 ms), the microprocessor 3 ceases to supply signal 12 to the triac 4. The triac 4 will thus stop conducting and therefore interrupt the first current path 35 when the alternating voltage passes through the 0 Volts point, as is conventional with triacs. The second current path 36 through the relay 5 therefore takes the current between the mains power supply and the load. The microprocessor 3 is now in "on" mode. This is advantageous as the triac 4 performs the switching to establish the current path 35, substantially reducing the chance of arcing across the contacts of the relay 5. Once the relay 5 has closed, the second current path 36 through the relay then forms the sole current path preventing overheating of the triac 4. Further, as the switching is performed at or near the zero crossing of the power supply voltage, there is little transient interference and conducted emissions.

The microprocessor 3 then waits a pre-set time, determined by the dip switch input 32, before initiating the "switch off" sequence to disconnect the mains power supply from the load. Prior to the expiry of the pre-set time period the microprocessor 3 initiates the charging of the switching capacitor 40 by the flyback converter 10 by supplying the PWM signal 13 as discussed above. The "switch off" sequence begins by the microprocessor 3 outputting a signal at 12, to supply the gate of the triac 4 with a pulsing gate signal 6, as described previously. The triac 4 will begin to conduct thereby establishing the first current path 35 between the mains power supply and the load in addition to the second current path 36. The microprocessor 3 then supplies the relay control output signal 16 to the relay control means 15, which energises the coil 8 using the power stored in the switching capacitor 40, causing the relay contacts to open and interrupt the second current path 36 between the mains power supply and the load. The mains power supply is then used to maintain the coil 8 in an energised state once the relay contacts are opened, as the mains power supply is now not supplying the load and is therefore available for energising the coil 8. As discussed above, the device 1 is constructed and arranged such that once the load is disconnected, the mains power supply is available to maintain the contacts of the relay 5 open. After a predetermined period of time, which is sufficient to allow the contacts of the relay 5 to open fully, the microprocessor 3 ceases to supply signal 12 to the triac 4. The triac 4 will therefore interrupt the first current path 35 when the alternating voltage passes through the 0 Volts point. This completes the "switch off" sequence whereby the microprocessor is in "off" mode and both the first current path 35 and second current path 36 are broken thereby disconnecting the load from the mains power supply.

If the microprocessor 3 is in "on" mode and receives an actuation signal 31, the pre-set time period is started again.

If the mains power supply fails during the pre-set time period i.e. when the microprocessor 3 is in "on" mode, the status of the microprocessor 3 will not change until pre-set period is close to expiry. Thus, the battery 20 will maintain the microprocessor 3 as well as supplying the power required to charge the capacitor of the flyback converter 10. The triac 4 will be activated and the coil 8 will then be energised and the triac deactivated as described above. However, when the microprocessor 3 fails to detect the presence of a mains power supply waveform at input 25 from the mains phase detection means 26, the coil 8 will be de-energised to conserve battery power and the contacts will adopt their normally closed position.

If the main power supply fails when the microprocessor is in "off" mode, the microprocessor 3 will cause the switching capacitor 40 to charge and thus energize the relay coil 8. If a mains power supply is not detected after 2 cycles of the mains power supply i.e. 40 ms then the coil 8 is de-energised. The microprocessor 3 will repeat the steps of energising the coil 8 and checking for a mains power supply several times in succession. If a mains power supply is not detected, then the microprocessor 3 will wait for a sleep period of 1 minute before energising the coil 8 and checking for a mains power supply again. On subsequent failures to find a mains power supply, the sleep period is increased to 2 minutes and then incremented by 1 minute on subsequent failures up a maximum of 5 hours. If after the sleep period is increased to 5 hours there is still no mains power supply the microprocessor 3 will stop attempting to check for re-establishment of the mains supply. To reactivate the microprocessor 3 to check for the mains supply signal requires the input of the actuation signal 31.

The invention claimed is:

1. A switching means for controlling the supply of power from a power supply to a load, the control switch comprising a solid-state switch arranged in parallel with a relay of normally closed type, the solid-state switch and the relay being arranged in series with the load and the power supply, the control switch also comprising a control means adapted to connect the power supply to the load by applying an activation signal to the solid-state switch to cause it to conduct, then de-energising the relay and then removing said activation signal to the solid-state switch in that order, and wherein the control means is also adapted to disconnect the power supply from the load by applying an activation signal to the solid-state switch to cause it to conduct, then energising the relay and then removing said activation signal to the solid-state switch in that order and wherein the activation signal comprises a series of pulses supplied from the control means.

2. A switching means according to claim 1, in which the power supply is the mains power supply.

3. A switching means according to claim 1, in which the power supply is a stored power source.

4. A switching means according to claim 1, in which the solid-state switch comprises a triac.

5. A switching means according to claim 1, in which the control means comprises a micro-controller.

6. A switching means according to claim 5, in which the micro-controller is a PIC (RTM) micro-controller manufactured by Microchip Technology Inc.

7. A switching means according to claim 5, in which a plurality of outputs from the micro-controller control means are used to supply the activation signal.

8. A switching means according to claim 1, in which the control switch includes a switching capacitor that is used to provide power for opening the contacts of the relay.

9. A switching means according to claim 8, in which the control switch includes a fly back converter to charge the switching capacitor with the power required to open the contacts of the relay.

10. A switching means according to claim 8, in which the control means is constructed and arranged such that once the relay contacts are opened by the switching capacitor, the power from the power supply maintains the contacts of the relay in the open position.

11. A switching means according to claim 1, in which the control means connects the load to the power supply in response to an actuation signal.

12. A switching means according to claim 11, in which the actuation signal is provided by one of a push-button, a touch sensor, a Passive Infrared (PIR) sensor or by an auxiliary device.

13. A switching means according to claim 1, in which the control switch includes a battery to provide power for the control means when the mains power supply is connected to the load.

14. A switching means according to claim 13, in which the battery is charged by the mains power supply when the mains power supply is disconnected from the load.

15. A method of operating a control switch that is adapted to control the supply of power from a mains power supply to a load, the control switch comprising a solid-state switch arranged in parallel with a normally closed relay the solid-state switch and the relay being arranged in series with the load and a mains power supply, the control switch also comprising a control means adapted to connect the mains power supply to the load by the following steps;

applying a signal comprising a series of pulses from the control means to the solid-state switch to cause it to conduct thereby providing a first current path between the mains power supply and the load;

(ii) de-energise the relay such that it provides a second current path between the mains power supply and the load;

(iii) after a predetermined period of time, remove the signal supplied to the solid-state switch to cause it to interrupt the first current path;

the control means being adapted to disconnect the mains power supply from the load by the following steps;

(i) applying a signal comprising a series of pulses from the control means to the solid-state switch to cause it to conduct thereby providing a first current path between the mains power supply and the load in addition to the second current path provided by the relay;

(ii) energising the relay to cause its contacts to open interrupting the second current path between the mains power supply and the load;

(iii) after a predetermined period of time, remove the signal supplied to the solid-state switch to cause it to interrupt the first current path between the mains power supply and the load.

* * * * *